(12) United States Patent
Park et al.

(10) Patent No.: US 11,404,659 B2
(45) Date of Patent: Aug. 2, 2022

(54) ORGANIC OPTOELECTRONIC DEVICE

(71) Applicant: UNIVERSITY-INDUSTRY COOPERATION GROUP OF KYUNG HEE UNIVERSITY, Yongin-si (KR)

(72) Inventors: Jongwook Park, Seoul (KR); Seokwoo Kang, Incheon (KR)

(73) Assignee: UNIVERSITY-INDUSTRY COOPERATION GROUP OF KYUNG HEE UNIVERSITY, Yongin-si (KR)

(*) Notice: Subject to any disclaimer, the term of this patent is extended or adjusted under 35 U.S.C. 154(b) by 301 days.

(21) Appl. No.: 16/686,331

(22) Filed: Nov. 18, 2019

(65) Prior Publication Data

US 2020/0373511 A1 Nov. 26, 2020

(30) Foreign Application Priority Data

May 22, 2019 (KR) .......................... 10-2019-0060271

(51) Int. Cl.
*H01L 51/50* (2006.01)
*H01L 51/00* (2006.01)
*H01L 51/52* (2006.01)

(52) U.S. Cl.
CPC ........ *H01L 51/5064* (2013.01); *H01L 51/004* (2013.01); *H01L 51/0035* (2013.01);
(Continued)

(58) Field of Classification Search
None
See application file for complete search history.

(56) References Cited

U.S. PATENT DOCUMENTS

2003/0186077 A1 10/2003 Chen
2016/0087209 A1 3/2016 Kawakami et al.

FOREIGN PATENT DOCUMENTS

CN 104672126 6/2015
JP 2000-286056 10/2000
(Continued)

OTHER PUBLICATIONS

Yi Chen et al., "High thermal-stability benzocarbazole derivatives as bipolar host materials for phosphorescent organic light-emitting diodes" Dyes and Pigments vol. 123, Dec. 2015, p. 196-203 [Abstract only].

*Primary Examiner* — Gregory D Clark
(74) *Attorney, Agent, or Firm* — Lex IP Meister, PLLC

(57) ABSTRACT

Disclosed is an optoelectronic device including a first electrode and a second electrode facing each other, a hole transport layer and an light emitting layer disposed between the first electrode and the second electrode, wherein the hole transport layer includes a compound represented by Chemical Formula 1 or a polymer thereof and the light emitting layer includes a perovskite compound.

[Chemical Formula 1]

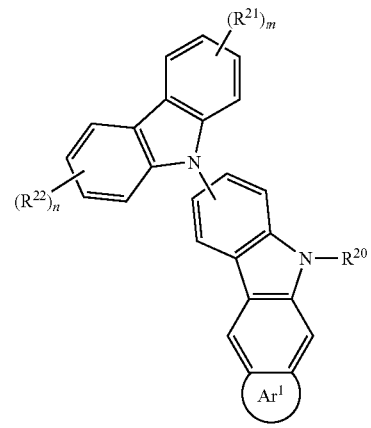

Definitions of Chemical Formula 1 are the same as described in the detailed description.

13 Claims, 1 Drawing Sheet

(52) U.S. Cl.
 CPC ...... *H01L 51/0042* (2013.01); *H01L 51/0072* (2013.01); *H01L 51/5072* (2013.01); *H01L 51/5206* (2013.01); *H01L 51/5221* (2013.01)

(56) References Cited

FOREIGN PATENT DOCUMENTS

| | | | | |
|---|---|---|---|---|
| JP | WO2009-133753 | | 9/2011 | |
| KR | 2012116881 | * | 4/2012 | ............ H01L 51/54 |
| KR | 10-2016-0023655 | | 3/2016 | |
| KR | 10-2018-0074577 | | 7/2018 | |

\* cited by examiner

ORGANIC OPTOELECTRONIC DEVICE

CROSS-REFERENCE TO RELATED APPLICATION

This application claims priority to and the benefit of Korean Patent Application No. 10-2019-0060271 filed in the Korean Intellectual Property Office on May 22, 2019, the entire contents of which are incorporated herein by reference.

BACKGROUND OF THE INVENTION

(a) Field of the Invention

The present invention relates to an optoelectronic device.

(b) Description of the Related Art

An organic optoelectronic device is a device that converts electrical energy into photoenergy, and vice versa.

An organic optoelectronic device may be classified as follows in accordance with its driving principles. One is a photoelectric device where excitons are generated by photoenergy, separated into electrons and holes, and are transferred to different electrodes to generate electrical energy, and the other is a light emitting diode where a voltage or a current is supplied to an electrode to generate photoenergy from electrical energy.

Examples of the organic optoelectronic diode may be a photoelectric device, a light emitting diode, and a solar cell.

Of these, an organic light emitting diode (OLED) has recently drawn attention due to an increase in demand for flat panel displays. The organic light emitting diode is a device that converts electrical energy into light by applying a current to an organic light emitting material, and has a structure in which an organic layer or an inorganic layer is inserted as an light emitting layer between an anode and a cathode.

Recently, interests in perovskite materials that may be manufactured in a simple process at low cost as the light emitting layer material are increasing. However, when the perovskite materials are used as the light emitting layer, there is a problem that the desired efficiency cannot be obtained by using the hole transport layer material that is commercially available.

SUMMARY OF THE INVENTION

An embodiment provides an optoelectronic device that may be manufactured in a simple process and has an excellent luminance and efficiency characteristics.

According to an embodiment, an optoelectronic device includes a first electrode and a second electrode facing each other, a hole transport layer and an light emitting layer disposed between the first electrode and the second electrode, wherein the hole transport layer includes a compound represented by Chemical Formula 1 or a polymer thereof and the light emitting layer includes a perovskite compound.

[Chemical Formula 1]

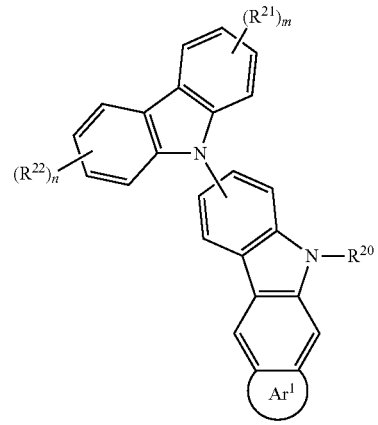

In Chemical Formula 1,
$R^{20}$ is a substituted or unsubstituted C1 to C20 alkyl group, a substituted or unsubstituted C6 to C20 aryl group, or a substituted or unsubstituted C3 to C20 heteroaryl group,
$Ar^1$ is a substituted or unsubstituted C6 to C20 arene group or a substituted or unsubstituted C3 to C20 heteroarene group,
$R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group,
m and n are independently an integer of 1 to 4, and
at least one of $R^{20}$, $Ar^1$, $R^{21}$, and $R^{22}$ has a polymerizable functional group.

Chemical Formula 1 may be represented by Chemical Formula 1-1.

[Chemical Formula 1-1]

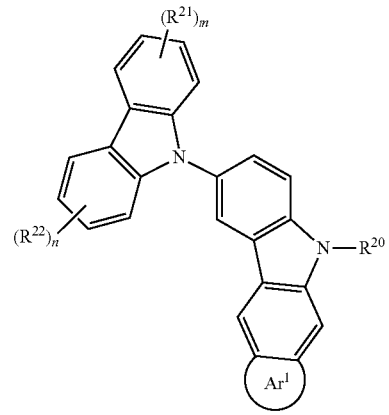

In Chemical Formula 1-1,
$R^{20}$ is a substituted or unsubstituted C1 to C20 alkyl group, a substituted or unsubstituted C6 to C20 aryl group, or a substituted or unsubstituted C3 to C20 heteroaryl group,
$Ar^1$ is a substituted or unsubstituted C6 to C20 arene group or a substituted or unsubstituted C3 to C20 heteroarene group,
$R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group,
m and n are independently an integer of 1 to 4, and
at least one of $R^{20}$, $Ar^1$, $R^{21}$, and $R^{22}$ has a polymerizable functional group.

$Ar^1$ may be a substituted or unsubstituted C6 to C20 arene group.

$R^{20}$ may be a substituted C6 to C20 aryl group as the polymerizable functional group.

The polymerizable functional group may be selected from a vinyl group, an allyl group, an epoxy group, an acrylate group, and a methacrylate group.

The hole transport layer may include a first hole transport layer and a second hole transport layer, the first hole transport layer may be disposed between the first electrode and the second hole transport layer, the second hole transport layer may be disposed between the first hole transport layer and the light emitting layer, and the compound represented by Chemical Formula 1 or the polymer may be included in the second hole transport layer. Herein, the first hole transport layer may include poly(9,9-dioctyl-fluorene-co-N-(4-butylphenyl)-diphenylamine), polyarylamine, poly(N-vinyl-carbazole), poly(3,4-ethylene dioxythiophene), poly(3,4-ethylene dioxythiophene)polystyrene sulfonate, polyaniline, polypyrrole, N, N, N', N'-tetrakis(4-methoxyphenyl)-benzidine, 4-bis[N-(1-naphthyl)-N-phenyl-amino]biphenyl, m-MTDATA, 4,4',4''-tris(N-carbazolyl)-triphenylamine, 1,1-bis(di-4-tolylamino)phenylcyclohexane, p-type metal oxide, graphene oxide, or a combination thereof.

The hole transport layer may include a polymer of a compound represented by Chemical Formula 1 and the polymer may be represented by Chemical Formula 2.

[Chemical Formula 2]

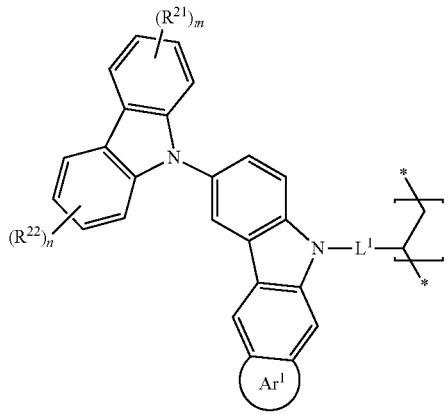

In Chemical Formula 2, $L^1$ is a substituted or unsubstituted C1 to C20 alkylene group, a substituted or unsubstituted C6 to C20 arylene group, or a substituted or unsubstituted C3 to C20 heteroarylene group, $Ar^1$ is a substituted or unsubstituted C6 to C20 arene group or a substituted or unsubstituted C3 to C20 heteroarene group, $R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, and m and n are independently an integer of 1 to 4, and at least one of $L^1$, $Ar^1$, $R^{21}$, and $R^{22}$ has a polymerizable functional group.

Chemical Formula 2 may be represented by Chemical Formula 2-1.

[Chemical Formula 2-1]

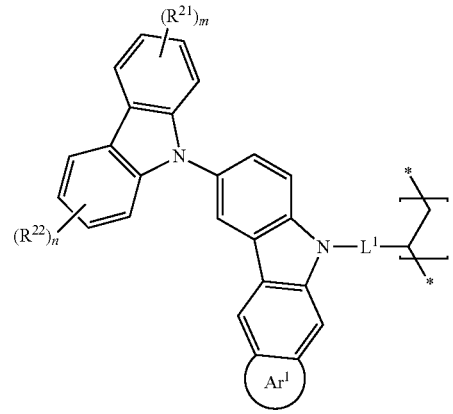

In Chemical Formula 2-1, $L^1$ is a substituted or unsubstituted C1 to C20 alkylene group, a substituted or unsubstituted C6 to C20 arylene group, or a substituted or unsubstituted C3 to C20 heteroarylene group, $Ar^1$ is a substituted or unsubstituted C6 to C20 arene group or a substituted or unsubstituted C3 to C20 heteroarene group, $R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, m and n are independently an integer of 1 to 4, and at least one of $L^1$, $Ar^1$, $R^{21}$, and $R^{22}$ has a polymerizable functional group.

$Ar^1$ may be a substituted or unsubstituted C6 to C20 arene group.

$L^1$ may be a C6 to C20 arylene group substituted with the polymerizable functional group.

The polymer may have a weight average molecular weight of about 2000 g/mol to about 7000 g/mol, for example about 2500 g/mol to about 6000 g/mol.

The perovskite compound may be a blue perovskite compound or a green perovskite compound.

The optoelectronic device may further include an electron transport layer between the second electrode and the light emitting layer.

The optoelectronic device exhibits excellent current efficiency, power efficiency, and external quantum efficiency.

BRIEF DESCRIPTION OF THE DRAWING

FIG. 1 is a cross-sectional view schematically showing a configuration of an optoelectronic device according to an embodiment.

DETAILED DESCRIPTION OF THE EMBODIMENTS

Hereinafter, embodiments of the present invention are described in detail. However, these embodiments are exemplary, the present invention is not limited thereto and the present invention is defined by the scope of claims.

As used herein, when a definition is not otherwise provided, "substituted" refers to replacement of at least one hydrogen of a substituent or a compound by deuterium, NH$_2$, a C1 to C4 amine group, a nitro group, a C1 to C4 silyl group, a C1 to C4 alkyl group, a C1 to C4 alkylsilyl group, a C1 to C4 alkoxy group, a fluoro group, a C1 to C4 trifluoroalkyl group, or a cyano group.

As used herein, when a definition is not otherwise provided, "hetero" refers to inclusion of 1 to 4 heteroatoms selected from, N, O, S, Se, Te, Si, and P.

As used herein, "arene group" refers to a hydrocarbon group having an aromatic ring, and includes monocyclic and polycyclic hydrocarbon groups, and the additional ring of the polycyclic hydrocarbon group may be an aromatic ring or a nonaromatic ring. "Heteroarene group" refers to an arene group including 1 to 3 heteroatoms selected from N, O, S, P, and Si.

As used herein, when a definition is not otherwise provided, "aryl group" refers to a group including at least one hydrocarbon aromatic moiety. All the elements of the hydrocarbon aromatic moiety have p-orbitals which form conjugation, for example a phenyl group, a naphthyl group, and the like, two or more hydrocarbon aromatic moieties may be linked by a sigma bond, for example a biphenyl group, a terphenyl group, a quarterphenyl group, and the like, and two or more hydrocarbon aromatic moieties are fused directly or indirectly to provide a non-aromatic fused ring, for example a fluorenyl group. The aryl group may include a monocyclic, polycyclic or fused polycyclic (i.e., rings sharing adjacent pairs of carbon atoms) functional group.

As used herein, when a definition is not otherwise provided, "heteroaryl group" refers to an aryl group including at least one heteroatom selected from N, O, S, Se, Te, P, and Si instead of carbon (C) in the ring. When the heteroaryl group is a fused ring, at least one of rings of the heteroaryl group may have a heteroatom or each ring may have a hetero atom.

As used herein, when a definition is not otherwise provided, "*" refers to a linking point between the same or different atoms, or chemical formulae.

Referring to FIG. 1, an optoelectronic device according to an embodiment is described.

FIG. 1 is a cross-sectional view schematically showing a configuration of an optoelectronic device according to an embodiment.

Referring to FIG. 1, an optoelectronic device 100 according to an embodiment includes a first electrode 10 and a second electrode 20a facing each other, and a hole transport layer 30 and a light emitting layer 40 disposed between the first electrode 10 and the second electrode 20.

One of the first electrode 10 and the second electrode 20 may be a cathode and the other may be an anode.

At least one of the first electrode 10 and the second electrode 20 may be a transparent electrode. For example, in the case that the first electrode 110 is a transparent electrode, it may realize a bottom emission in which light is emitted to the first electrode 10 side, and in the case that the second electrode 20 is a transparent electrode, it may realize a top emission in which light is emitted to the second electrode 20 side. In addition, when both the first electrode 10 and the second electrode 20 are transparent electrodes, both sides emission may be realized.

The hole transport layer 30 includes a compound represented by Chemical Formula 1 or a polymer thereof, and the light emitting layer 40 includes a perovskite compound.

[Chemical Formula 1]

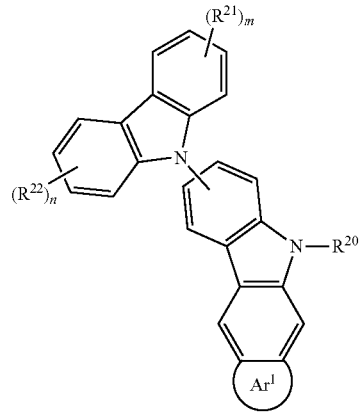

In Chemical Formula 1,

R$^{20}$ is a substituted or unsubstituted C1 to C20 alkyl group, a substituted or unsubstituted C6 to C20 aryl group, or a substituted or unsubstituted C3 to C20 heteroaryl group, Ar$^1$ is a substituted or unsubstituted C6 to C20 arene group or a substituted or unsubstituted C3 to C20 heteroarene group, R$^{21}$ and R$^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, m and n are independently an integer of 1 to 4, and at least one of R$^{20}$, Ar$^1$, R$^{21}$, and R$^{22}$ has a polymerizable functional group.

For example, Chemical Formula 1 may be represented by Chemical Formula 1-1.

[Chemical Formula 1-1]

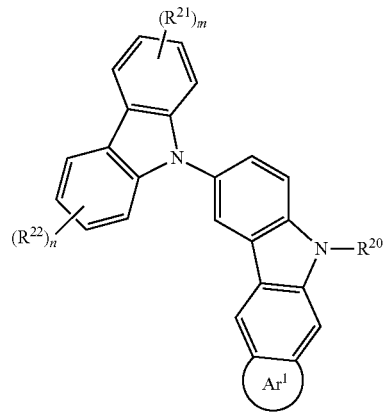

In Chemical Formula 1-1,

R$^{20}$ is a substituted or unsubstituted C1 to C20 alkyl group, a substituted or unsubstituted C6 to C20 aryl group, or a substituted or unsubstituted C3 to C20 heteroaryl group, Ar$^1$ is a substituted or unsubstituted C6 to C20 arene group or a substituted or unsubstituted C3 to C20 heteroarene group, R$^{21}$ and R$^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, m and n are independently an integer of 1 to 4, and at least one of R$^{20}$, Ar$^1$, R$^{21}$, and R$^{22}$ has a polymerizable functional group.

For example, $Ar^1$ may be a substituted or unsubstituted C6 to C20 arene group.

For example, $Ar^1$ may be represented by Chemical Formula A.

[Chemical Formula A]

For example, $R^{20}$ may be a C6 to C20 arylene group substituted with a polymerizable functional group.

The polymerizable functional group may be selected from a vinyl group, an allyl group, an epoxy group, an acrylate group, and a methacrylate group, but is not limited thereto. The polymerizable functional group forms a cross-linking bond with each other to provide a polymer.

For example, the hole transport layer may include a first hole transport layer and a second hole transport layer, the first hole transport layer may be disposed between the first electrode and the second hole transport layer, the second hole transport layer may be disposed between the first hole transport layer and the light emitting layer, and the compound represented by Chemical Formula 1 or the polymer thereof may be included in the second hole transport layer.

When the hole transport layer is composed of the first hole transport layer and second hole transport layer, the first hole transport layer may include poly(9,9-dioctyl-fluorene-co-N-(4-butylphenyl)-diphenylamine), polyarylamine, poly(N-vinylcarbazole), poly(3,4-ethylene dioxythiophene), poly(3,4-ethylene dioxythiophene)polystyrene sulfonate, polyaniline, polypyrrole, N,N,N',N'-tetrakis(4-methoxyphenyl)-benzidine, 4-bis[N-(1-naphthyl)-N-phenyl-amino]biphenyl, m-MTDATA, 4,4',4"-tris(N-carbazolyl)-triphenylamine, 1,1-bis(di-4-tolylamino)phenylcyclohexane, p-type metal oxide, graphene oxide, or a combination thereof.

The polymer may have a weight average molecular weight of about 2000 g/mol to about 7000 g/mol, for example about 2500 g/mol to about 6000 g/mol.

The polymer may have a bandgap of about 1 eV to about 5 eV, for example about 2 eV to about 4 eV.

Specific examples of the compound represented by Chemical Formula 1 may be one of Chemical Formula E-1 to Chemical Formula E-6, but is not necessarily limited thereto.

[Chemical Formula E-1]

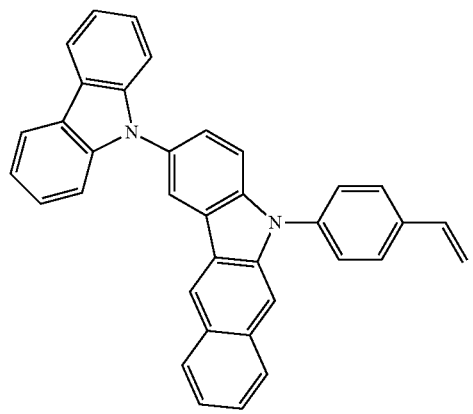

[Chemical Formula E-2]

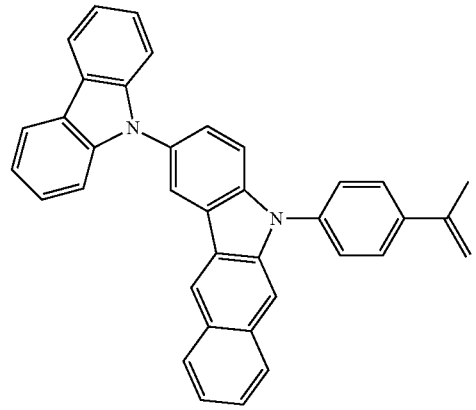

[Chemical Formula E-3]

[Chemical Formula E-4]

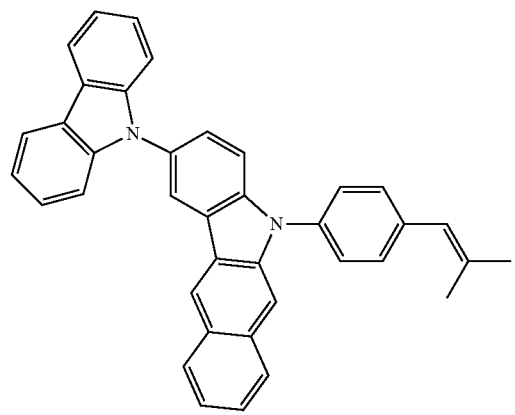

-continued

[Chemical Formula E-5]

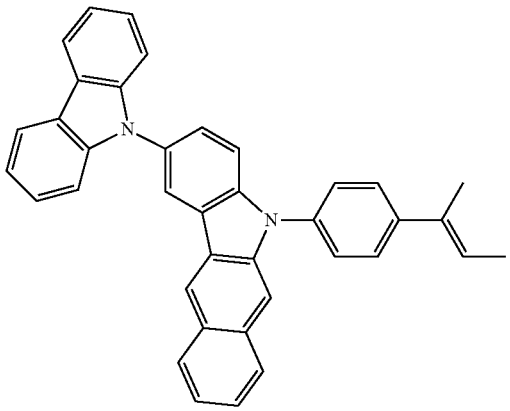

[Chemical Formula E-6]

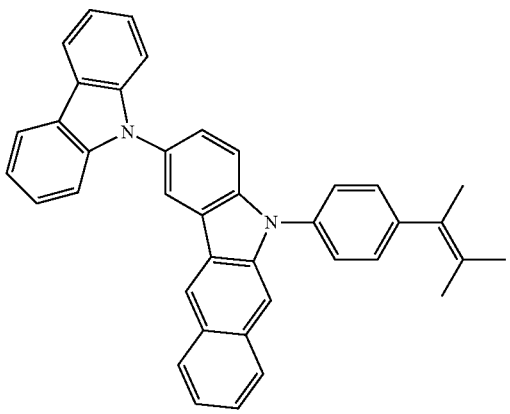

For example, the hole transport layer may include a polymer of a compound represented by Chemical Formula 1, and the polymer may be represented by Chemical Formula 2.

[Chemial Formula 2]

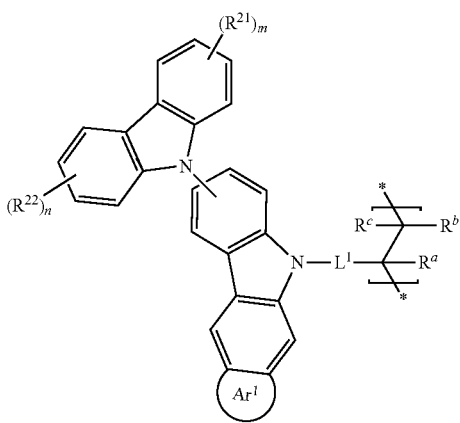

In Chemical Formula 2, $L^1$ is a substituted or unsubstituted C1 to C20 alkylene group, a substituted or unsubstituted C6 to C20 arylene group, or a substituted or unsubstituted C3 to C20 heteroarylene group, $Ar^1$ is a substituted or unsubstituted C6 to C20 arene group or a substituted or unsubstituted C3 to C20 heteroarene group, $R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, $R^a$ to $R^c$ are independently a hydrogen atom or a substituted or unsubstituted C1 to C20 alkyl group, m and n are independently an integer of 1 to 4, and at least one of $L^1$, $Ar^1$, $R^{21}$, and $R^{22}$ has a polymerizable functional group.

For example, Chemical Formula 2 may be represented by Chemical Formula 2-1.

[Chemical Formula 2-1)

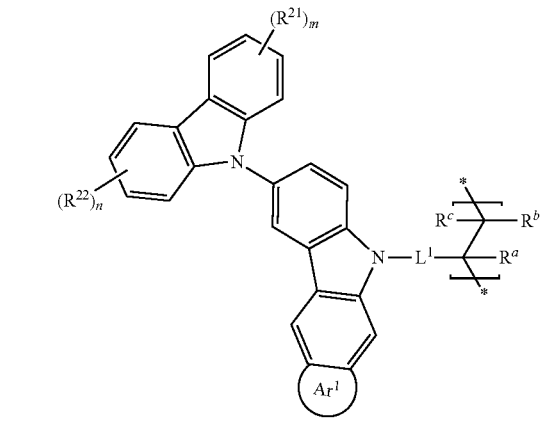

In Chemical Formula 2-1, $L^1$ is a substituted or unsubstituted C1 to C20 alkylene group, a substituted or unsubstituted C6 to C20 arylene group, or a substituted or unsubstituted C3 to C20 heteroarylene group, $Ar^1$ is a substituted or unsubstituted C6 to C20 arene group or a substituted or unsubstituted C3 to C20 heteroarene group, $R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, $R^a$ to $R^c$ are independently a hydrogen atom or a substituted or unsubstituted C1 to C20 alkyl group, m and n are independently an integer of 1 to 4, and at least one of $L^1$, $Ar^1$, $R^{21}$, and $R^{22}$ has a polymerizable functional group.

For example, $Ar^1$ may be a substituted or unsubstituted C6 to C20 arene group.

For example, $L^1$ may be a C6 to C20 arylene group substituted with the polymerizable functional group.

Specific examples of the polymer of the compound represented by Chemical Formula 1 include any of Chemical Formula E-7 to Chemical Formula E-12 but are not limited thereto.

[Chemical Formula E-7]

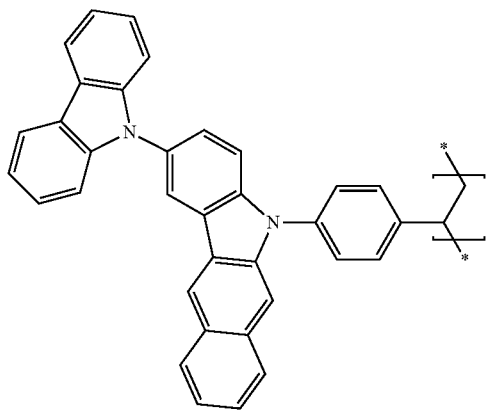

[Chemical Formula E-8]

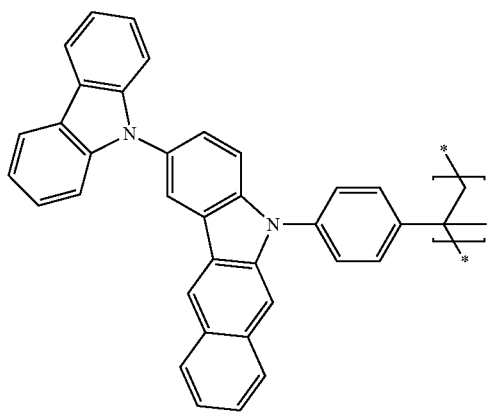

[Chemical Formula E-9]

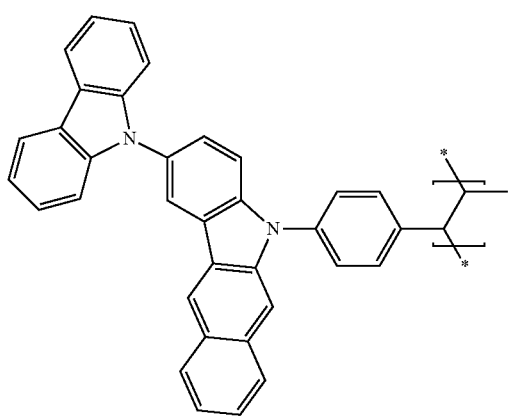

[Chemical Formula E-10]

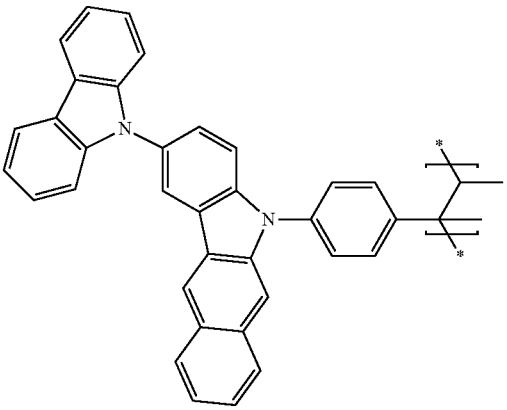

[Chemical Formula E-11]

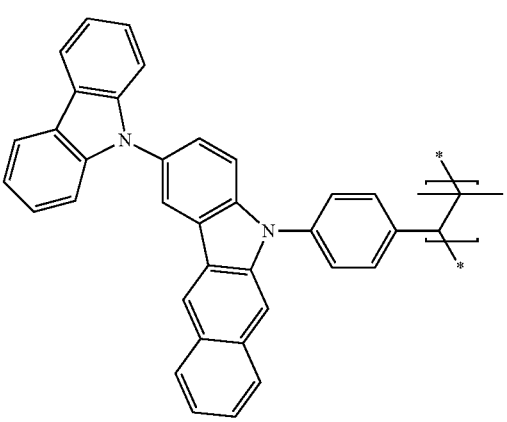

[Chemical Formula E-12]

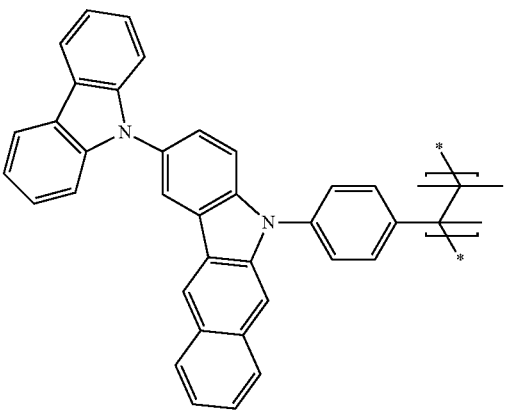

The hole transport layer 30 may further include at least one of poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylene dioxythiophene)polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl(α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), p-type metal oxide (e.g., NiO, $WO_3$, $MoO_3$, etc.), a carbon-based hole transport material such as graphene oxide, and a combination thereof, in addition to the polymer in a single hole transport layer 30, in addition to the first hole transport layer and the second hole transport layer, as described above. These hole transport materials may be used in a range of about 10 parts by weight to about 90 parts by weight based on 100 parts by weight of the polymer, but are not necessarily limited.

The hole transport layer 30 may be formed by applying a solution in which 'at least one of the compound represented by Chemical Formula 1 and the polymer thereof' and optionally an additional hole transport material is dissolved in the solvent, irradiating the resultant with heat or light to induce cross-linking bonds, and then drying and annealing the resultant.

The solution may be applied using a spin coating, a dipping, a flow coating, or the like.

The light emitting layer 40 may include a perovskite compound, and the perovskite compound may be represented by Chemical Formula 3.

(AB)MX$_3$ [Chemical Formula 3]

In Chemical Formula 3,

AB is a monovalent metal cation or a ammonium cation represented by R—NH$_3$+, R$^6$ is one of a C1 to C20 alkyl group, a C6 to C20 aryl group, and a C4 to C20 heteroaryl group. The halogen ion may be specifically an anion of chlorine, bromine, iodine, fluorine, and the like.

Examples of the perovskite compound of Chemical Formula 3 may be at least one compound selected from CH$_3$NH$_3$PbI$_3$, CH$_3$NH$_3$PbBr$_3$, CH$_3$NH$_3$PbCl$_3$, CH$_3$NH$_3$PbF$_3$, CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnBrI$_2$, CH$_3$NH$_3$SnBrCl$_2$, CH$_3$NH$_3$SnF$_2$Br, CH$_3$NH$_3$SnIBr$_2$, CH$_3$NH$_3$SnICl$_2$, CH$_3$NH$_3$SnF$_2$I, CH$_3$NH$_3$SnClBr$_2$, CH$_3$NH$_3$SnI$_2$Cl, and CH$_3$NH$_3$SnF$_2$Cl, but are not limited thereto.

For example, the perovskite compound may be a blue perovskite compound or a green perovskite compound.

The light emitting layer 40 may further include a dopant in addition to the perovskite compound. Such a dopant may be a red, green, or blue dopant. The dopant is a material in small amount to cause light emission on the host, generally a material such as a metal complex that emits light by multiple excitation into a triplet or more. The dopant may be for example an inorganic, organic, or organic/inorganic compound, and may include one or more species.

The dopant may be included in an amount of about 0.1 wt % to about 20 wt % based on a total amount of the light emitting layer. Examples of the dopant may be a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. The phosphorescent dopant may be a compound represented by Chemical Formula 4, but is not limited thereto.

L$_2$MX [Chemical Formula 4]

In Chemical Formula 4,

M is a metal and L and X are the same or different and ligands that form a complex compound with M.

The M may be for example Ir, Pt, Os, Ti, Zr, Hf, Eu, Tb, Tm, Fe, Co, Ni, Ru, Rh, Pd, or a combination thereof and the L and X may be for example bidendate ligands.

The optoelectronic device 100 may further include an electron transport layer between the second electrode 20 and the light emitting layer 40.

In addition, the optoelectronic device 100 may further include an electron injection layer and a hole injection layer to enhance the injection of electrons and holes.

The optoelectronic device is not particularly limited as long as it is a device capable of converting electrical energy and light energy. Examples of the optoelectronic device include a photoelectric device, a light emitting diode, and a solar cell.

The aforementioned light emitting diode may be applied to a light emitting display device.

Hereinafter, the embodiments are illustrated in more detail with reference to examples. These examples, however, are not in any sense to be interpreted as limiting the scope of the invention.

SYNTHESIS EXAMPLE 1: SYNTHESIS OF COMPOUND REPRESENTED BY CHEMICAL FORMULA E-1

[Reaction Scheme]

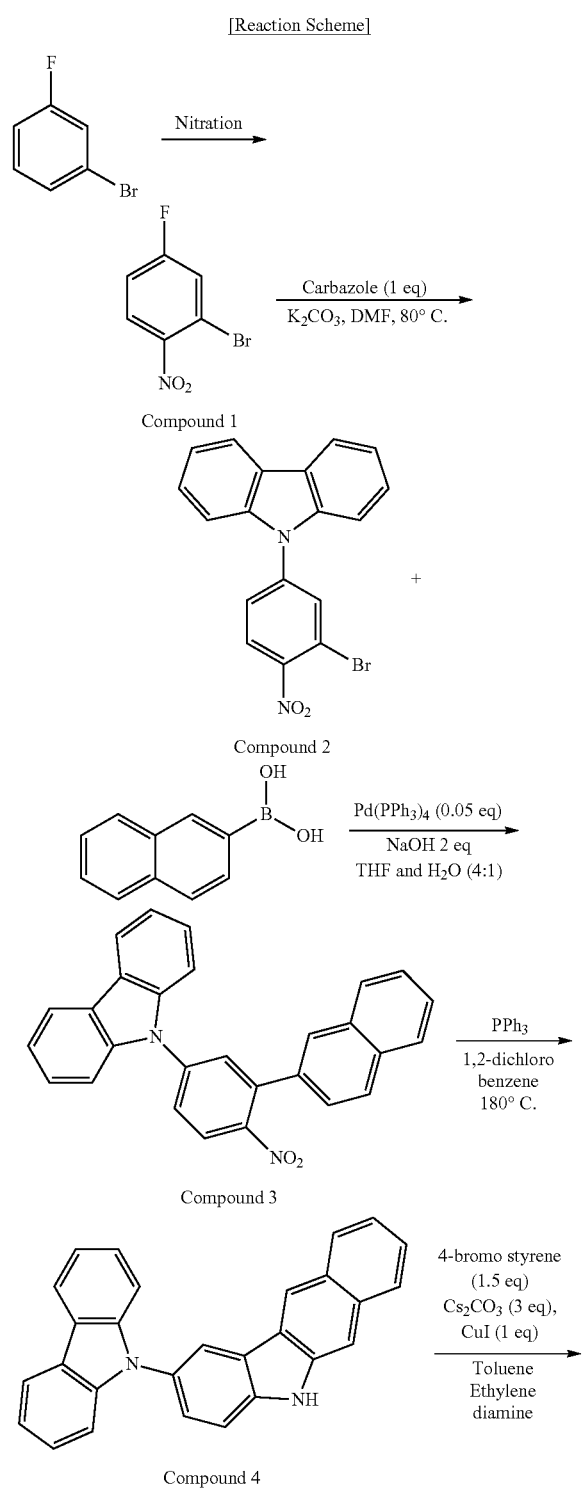

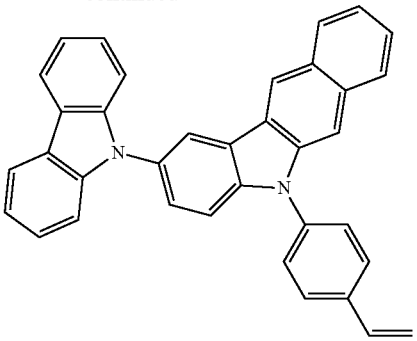

Chemical Formula E-1

Synthesis of Compound 1: A mixture of 65% nitric acid (1.5 mL) in 98% of sulfuric acid (12.0 mL) and 1-bromo-3-fluorobenzene (30 mmol) was maintained at 0° C. for 15 minutes and then, extracted with ground ice (20 g) and dichloromethane (40 mL), and the solvent was removed therefrom. The residue was purified through silica gel flash chromatography of eluting with petroleum ether (60 to 90° C.) to obtain Compound 1 as lemon yellow crystals at a yield of 58%.

$^1$H NMR (300 MHz, CDCl3): δ 8.00-7.95 (m, 1H), 7.51-7.48 (m, 1H), 7.22-7.16 (m, 1H) ppm; 13C NMR (100 MHz, CDCl3): 165.5, 162.0, 128.0, 127.9, 127.2, 127.1, 122.6, 122.3, 115.7, 115.4 ppm.

Synthesis of Compound 2: A mixture of 2-bromo-4-fluoronitrobenzene (Compound 1, 1 mL), carbazole (1.1 mmol), and $K_2CO_3$ (1.2 mmol) in DMF (5 mL) was stirred at 80° C. and 24 hours later, treated with ice water and ethyl acetate subsequently at room temperature, an organic layer therein was gathered, and the solvent was removed therefrom by using an evaporator. The residue was purified through silica gel column chromatography of eluting with HX (hexane) & EA (ethyl acetate) (1:4) to obtain Compound 2 at a yield of 70%.

$^1$H NMR (300 MHz, CDCl3): δ 8.12 (d, J=8.2 Hz, 3H), 7.98 (d, J=1.8 Hz, 1H), 7.69 (dd, J=1.8, 6.6 Hz, 1H), 7.45-7.43 (m, 4H), 7.36-7.30 (m, 2H) ppm; 13C NMR (100 MHz, CDCl3): 147.3, 142.4, 139.7, 132.4, 127.4, 126.6, 125.6, 124.2, 121.4, 120.7, 116.3, 109.5 ppm.

Synthesis of Compound 3: A THF (5 mL) solution of Compound 2 (7.5 mmol), Pd(PPh$_3$)$_4$ (0.25 mmol), and NaOH (15.0 mmol) was prepared, and 3-bromo-4-nitrophenyl)-9H-carbazole (5.0 mmol) and 10 mL of a mixed solution of 2-naphthalene boric acid and THF/H$_2$O (3/1) were added thereto and then, stirred at 80° C. The solution was cooled down to room temperature for 2 hours, 40 mL of water was added thereto, the obtained solution was three times extracted with 50 mL of DCM, and an organic layer gathered therefrom was dried by using magnesium sulfate, concentrated under a reduced pressure, and purified through column chromatography (HX & EA (1:4)) to obtain Compound 3 at a yield of 85%.

$^1$H NMR (300 MHz, CDCl3): δ 8.22 (d, J=6.0 Hz, 1H), 8.15 (d, J=9.0 Hz, 2H), 7.95-7.87 (m, 4H), 7.82-7.76 (m, 2H), 7.57-7.44 (m, 7H), 7.38-7.32 (m, 2H) ppm; 13C NMR (100 MHz, CDCl3): 142.0, 137.6, 135.9, 132.8, 130.0, 129.2, 125.9, 125.7, 125.2, 124.5, 123.1, 121.1, 120.8, 120.5, 120.3, 119.6, 119.2, 119.1, 118.3, 112.1, 109.9 ppm.

Synthesis of Compound 4: 2.01 g (5.0 mmol) of Compound 3 and 3.9 g (15 mmol) of triphenylphosphine (PPh$_3$) were dissolved in 20 ml of 1,2-dichlorobenzene and then, stirred at 170° C. The solution was cooled down to room temperature for 24 hours, and after removing the 1,2-dichloro benzene solvent through a filter column with hexane, the remaining unpurified mixture was filtered with ethyl acetate and then, separated through column chromatography with 10% HX & EA (1:4) to obtain Compound 4.

$^1$H NMR (300 MHz, CDCl3): δ 8.90 (bs, 1H), 8.23-8.17 (m, 4H), 8.04 (t, J=8.9 Hz, 2H), 7.73-7.55 (m, 5H), 7.41-7.40 (m, 4H), 7.29-7.25 (m, 2H) ppm; 13C NMR (100 MHz, CDCl3): 142.0, 137.6, 135.9, 132.7, 130.0, 129.2, 125.9, 125.7, 125.2, 124.5, 123.1, 121.1, 120.8, 120.5, 120.3, 119.6, 119.2, 119.1, 118.3, 112.1, 109.9 ppm.

Synthesis of Compound Represented by Chemical Formula E-1: 1.1 g (3.0 mmol) of Compound 4, 2.9 g (9.0 mmol) of cerium carbonate, and 0.45 g (2.4 mmol) of copper(I) iodide were put in a sealed tube and sealed with a rubber diaphragm, 15 ml of toluene was added thereto, 0.82 g (4.5 mmol) of 4-bromo styrene and 0.14 g (2.4 mmol) of ethylene diamine were added to the mixture under presence of nitrogen and then, refluxed for 16 hours. The solution was cooled down to room temperature and then, three times extracted with 50 mL of water and 50 mL of ethyl acetate. An organic layer gathered therefrom was dried with magnesium sulfate, the solvent was distilled and removed under a reduced pressure, and the residue was separated and purified through silica gel column chromatography to obtain a compound represented by Chemical Formula E-1 at a yield of 65%.

$^1$H NMR (300 MHz, CDCl3): δ 8.32 (s, 1H), 8.20-8.13 (m, 3H), 8.00 (d, J=9.0 Hz, 1H), 7.72 (d, J=9 Hz, 3H), 7.59-7.23 (m, 13H), 6.96 (dd, J=12.0, 6.0 Hz, 1H), 5.92 (d, J=18.0 Hz, 1H), 5.45 (d, J=9.0 Hz, 1H) ppm; 13C NMR (100 MHz, CDCl3): 141.9, 141.1, 139.1, 138.4, 136.3, 135.9, 133.8, 130.4, 129.3, 129.1, 128.0, 125.9, 125.3, 125.2, 124.6, 124.3, 123.1, 122.3, 122.1, 121.7, 120.3, 119.6, 119.2, 119.0, 118.6, 115.6, 111.5, 109.9 ppm.

SYNTHESIS EXAMPLE 2: SYNTHESIS OF POLYMER OF COMPOUND REPRESENTED BY CHEMICAL FORMULA E-1

[Reaction Scheme]

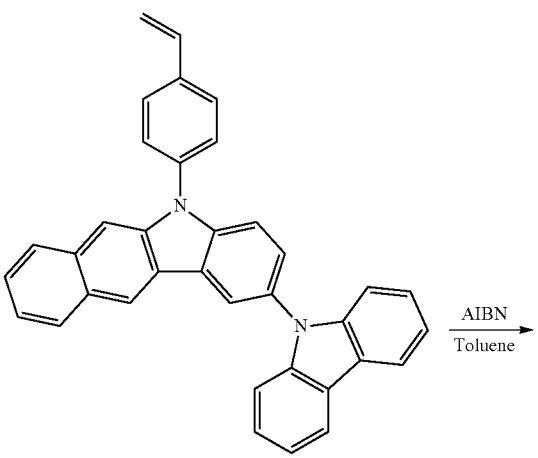

Chemical Formula E-1

-continued

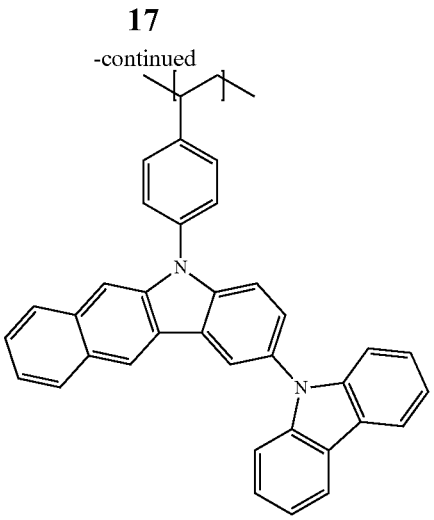

Polymerization: 10 mg of an initiator (AIBN) was put in a 250 mL 3-necked flask equipped with a reflux cooler, while nitrogen was passed therethrough. 100 mL of anhydrous toluene was mixed with 10 mL of the compound represented by Chemical Formula E-1, put in the 250 mL 3-necked flask, and then, dipped in a water bath. While stirred, the water bath was heated to gradually increase viscosity of the solution. After a sufficient amount of time, when a polymerization was complete, the flask was cooled down, a polymer produced therein was slowly dropped into 500 mL of methanol to form precipitates and obtain a polymer (2953 g/mol) of the compound represented by Chemical Formula E-1.

(Manufacture of Optoelectronic Device)

EXAMPLE 1

A glass substrate coated with ITO (indium tin oxide) to be 1500 Å thick was ultrasonic wave-washed with a distilled water. Subsequently, the glass substrate was ultrasonic wave-washed with a solvent such as isopropyl alcohol, acetone, methanol, and the like, moved to a plasma cleaner, cleaned by using oxygen plasma for 10 minutes, and then, moved to a vacuum depositor. This obtained ITO transparent electrode was used as an anode, PEDOT was spin-coated on the ITO substrate at 4,000 rpm for 60 seconds and annealed at 140° C. for 20 minutes to form a first hole transport layer with a thickness of 400 Å. A second hole transport layer was formed by spin-coating the polymer (Synthesis Example 2) of the compound represented by Chemical Formula E-1 on the first hole transport layer to a thickness of 150 Å. A blue perovskite compound was spin-coated on the second hole transport layer to form a light emitting layer having a thickness of 1000 Å. Subsequently, an electron transport layer having a thickness of 500 Å was formed by vacuum-depositing TPBi on the light emitting layer, and a cathode was formed by sequentially depositing LiF to be 10 Å and Al to be 1000 Å on the electron transport layer, manufacturing an optoelectronic device.

A structure of the optoelectronic device is specifically as follows.

ITO (1500 Å)/PEDOT (400 Å)/the polymer of the compound represented by Chemical Formula E-1 (150 Å)/light emitting layer [blue perovskite] (1000 Å)/TPBi (500 Å)/LiF (10 Å)/Al (1000 Å)

EXAMPLE 2

An optoelectronic device was manufactured according to the same method as that of Example 1 except that a green perovskite compound was used instead of the blue perovskite compound.

A structure of the optoelectronic device is specifically as follows.

ITO (1500 Å)/PEDOT (400 Å)/the polymer of the compound represented by Chemical Formula E-1 (150 Å)/light emitting layer [green perovskite] (1000 Å)/TPBi (500 Å)/LiF (10 Å)/Al (1000 Å)

COMPARATIVE EXAMPLE 1

An optoelectronic device was manufactured according to the same method as that of Example 1 except that the second hole transport layer was not deposited.

A structure of the optoelectronic device is specifically as follows.

ITO (1500 Å)/PEDOT (400 Å)/light emitting layer [blue perovskite] (1000 Å)/TPBi (500 Å)/LiF (10 Å)/Al (1000 Å)

COMPARATIVE EXAMPLE 2

An optoelectronic device was manufactured according to the same method as that of Example 1 except that PVK (poly(N-vinylcarbazole)) was used instead of the polymer of the compound represented by Chemical Formula E-1.

A structure of the optoelectronic device and a structure of PVK are specifically as follows.

ITO (1500 Å)/PEDOT (400 Å)/PVK (150 Å)/light emitting layer[blue perovskite] (1000 Å)/TPBi (500 Å)/LiF (10 Å)/Al (1000 Å)

[Structure of PVK]

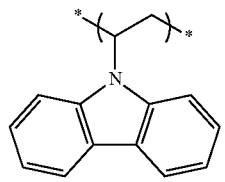

COMPARATIVE EXAMPLE 3

An optoelectronic device was manufactured according to the same method as that of Comparative Example 1 except that the green perovskite compound was used instead of the blue perovskite compound.

A structure of the optoelectronic device is specifically as follows.

ITO (1500 Å)/PEDOT (400 Å)/light emitting layer [green perovskite] (1000 Å)/TPBi (500 Å)/LiF (10 Å)/Al (1000 Å)

COMPARATIVE EXAMPLE 4

An optoelectronic device was manufactured according to the same method as that of Comparative Example 2 except that the green perovskite compound was used instead of the blue perovskite compound.

A structure of the optoelectronic device is specifically as follows.

ITO (1500 Å)/PEDOT (400 Å)/PVK 150 Å/light emitting layer [green perovskite] (1000 Å)/TPBi (500 Å)/LiF (10 Å)/Al (1000 Å)

Evaluation:

Turn-on voltage, Max. luminance, Max. current efficiency, Max. EQE, and $EL_{max}$ of the optoelectronic devices according to Examples 1 and 2 and Comparative Examples 1 to 4 were measured, and the results are shown in Tables 1 and 2.

Turn-on Voltage: a voltage at luminance of 1 cd/m$^2$

Max. Luminance: the highest luminance, while a voltage (0 to 20V) is applied

Max. current efficiency: the highest current efficiency, when a current of current density depending on a voltage flows Max. EQE: the highest EQE (External Quantum Efficiency), when a current of current density depending on a voltage flows $EL_{max}$: a maximum wavelength of light emitted from excitons formed by holes and electrons, when driven by a current

TABLE 1

|  | Turn-on Voltage* (V) | Max. Luminance (cd/m$^2$) | Max. current efficiency (cd/A) | Max. EQE (%) | $EL_{max}$ (nm) |
| --- | --- | --- | --- | --- | --- |
| Example 1 | 3.2 | 2259 | 8.10 | 3.50 | 495 |
| Comparative Example 1 | 3.3 | 143 | 1.01 | 0.39 | 495 |
| Comparative Example 2 | 3.8 | 296 | 3.22 | 0.95 | 495 |

*Luminance 1 cd/m$^2$

TABLE 2

|  | Turn-on Voltage* (V) | Max. Luminance (cd/m$^2$) | Max. current efficiency (cd/A) | Max. EQE (%) | $EL_{max}$ (nm) |
| --- | --- | --- | --- | --- | --- |
| Example 2 | 3.2 | 84817 | 34.29 | 3.91 | 510 |
| Comparative Example 3 | 3.5 | 15497 | 10.6 | 1.23 | 510 |
| Comparative Example 4 | 3.6 | 50454 | 19.45 | 2.26 | 510 |

*Luminance 1 cd/m$^2$

Referring to Table 1 and Table 2, the optoelectronic devices according to embodiments (Examples 1 and 2) exhibit improved luminance, current efficiency, power efficiency, and external quantum efficiency than the optoelectronic devices according to Comparative Example 1 to Comparative Example 4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

DESCRIPTION OF SYMBOLS

100: optoelectronic device
10: first electrode
20: second electrode
30: hole transport layer
40: light emitting layer

What is claimed is:

1. An optoelectronic device comprising
a first electrode and a second electrode facing each other,
a hole transport layer and a light emitting layer disposed between the first electrode and the second electrode,
wherein the hole transport layer comprises a compound represented by Chemical Formula 1 or a polymer thereof, and
the light emitting layer comprises a perovskite compound:

[Chemial Formula 1]

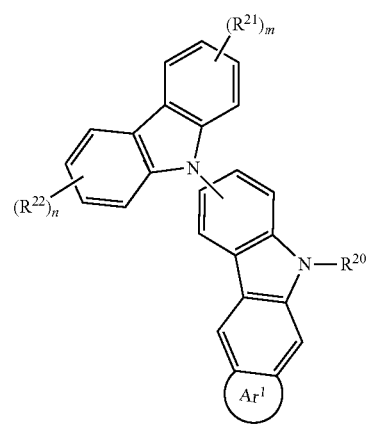

wherein, in Chemical Formula 1,
R$^{20}$ is a substituted or unsubstituted C1 to C20 alkyl group, a substituted or unsubstituted C6 to C20 aryl group, or a substituted or unsubstituted C3 to C20 heteroaryl group,
Ar$^1$ is a substituted or unsubstituted C6 to C20 arene group,
R$^{21}$ and R$^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group,
m and n are independently an integer of 1 to 4, and
at least one of R$^{20}$, Ar$^1$, R$^{21}$, and R$^{22}$ has a polymerizable functional group.

2. The optoelectronic device of claim 1, wherein Chemical Formula 1 is represented by Chemical Formula 1-1:

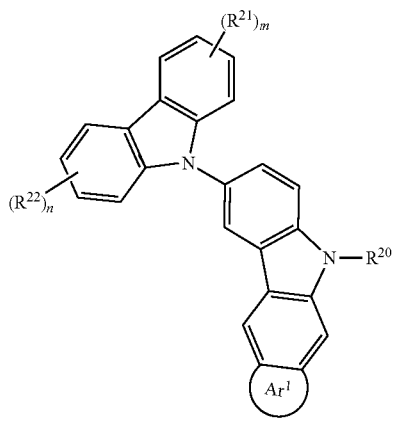

[Chemial Formula 1-1]

wherein, in Chemical Formula 1-1,
R$^{20}$ is a substituted or unsubstituted C1 to C20 alkyl group, a substituted or unsubstituted C6 to C20 aryl group, or a substituted or unsubstituted C3 to C20 heteroaryl group,
Ar$^1$ is a substituted or unsubstituted C6 to C20 arene group,
R$^{21}$ and R$^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group,
m and n are independently an integer of 1 to 4, and
at least one of R$^{20}$, Ar$^1$, R$^{21}$, and R$^{22}$ has a polymerizable functional group.

3. The optoelectronic device of claim 1, wherein R$^{20}$ is a C6 to C20 arylene group substituted with a polymerizable functional group.

4. The optoelectronic device of claim 1, wherein the polymerizable functional group is selected from a vinyl group, an allyl group, an epoxy group, an acrylate group, and a methacrylate group.

5. The optoelectronic device of claim 1, wherein
the hole transport layer comprises a first hole transport layer and a second hole transport layer,
the first hole transport layer is disposed between the first electrode and the second hole transport layer,
the second hole transport layer is disposed between the first hole transport layer and the light emitting layer, and
the compound represented by Chemical Formula 1 or the polymer thereof is included in the second hole transport layer.

6. The optoelectronic device of claim 5, wherein the first hole transport layer comprises poly(9,9-dioctyl-fluorene-co-N-(4-butylphenyl)-diphenylamine), polyarylamine, poly(N-vinylcarbazole), poly(3,4-ethylene dioxythiophene), poly(3,4-ethylene dioxythiophene)polystyrene sulfonate, polyaniline, polypyrrole, N,N,N',N'-tetrakis(4-methoxyphenyl)-benzidine, 4-bis[N-(1-naphthyl)-N-phenyl-amino]biphenyl, m-MTDATA, 4,4',4''-tris(N-carbazolyl)-triphenylamine, 1,1-bis(di-4-tolylamino)phenylcyclohexane, p-type metal oxide, graphene oxide, or a combination thereof.

7. An optoelectronic device comprising
a first electrode and a second electrode facing each other,
a hole transport layer and a light emitting layer disposed between the first electrode and the second electrode,
wherein
the hole transport layer comprises a polymer of a compound represented by Chemical Formula 1, and
the polymer is represented by Chemical Formula 2:

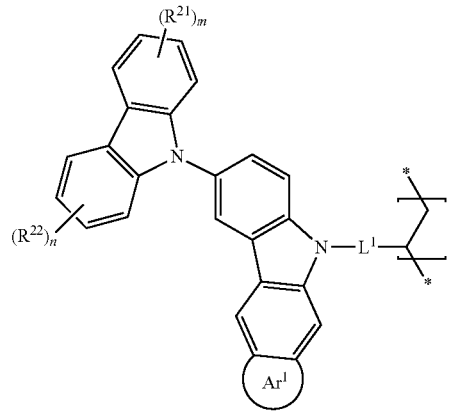

[Chemical Formula 2]

wherein, in Chemical Formula 2,
L$^1$ is a substituted or unsubstituted C1 to C20 alkylene group, a substituted or unsubstituted C6 to C20 arylene group, or a substituted or unsubstituted C3 to C20 heteroarylene group,
Ar$^1$ is a substituted or unsubstituted C6 to C20 arene group or a substituted or unsubstituted C3 to C20 heteroarene group,
R$^{21}$ and R$^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group,
m and n are independently an integer of 1 to 4, and
at least one of L$^1$, Ar$^1$, R$^{21}$, and R$^{22}$ has a polymerizable functional group.

8. The optoelectronic device of claim 7, wherein Chemical Formula 2 is represented by Chemical Formula 2-1:

[Chemical Formula 2-1]

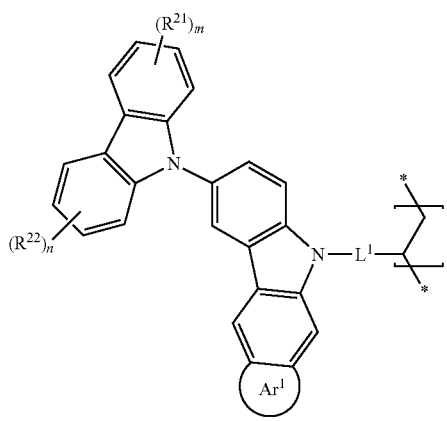

wherein, in Chemical Formula 2-1, $L^1$ is a substituted or unsubstituted C1 to C20 alkylene group, a substituted or unsubstituted C6 to C20 arylene group, or a substituted or unsubstituted C3 to C20 heteroarylene group, $Ar^1$ is a substituted or unsubstituted C6 to C20 arene group or a substituted or unsubstituted C3 to C20 heteroarene group, $R^{21}$ and $R^{22}$ are independently hydrogen, a halogen, a substituted or unsubstituted C1 to C20 alkyl group, a substituted or unsubstituted C6 to C20 aryl group, or a substituted or unsubstituted C3 to C20 heteroaryl group, m and n are independently an integer of 1 to 4, and at least one of $L^1$, $Ar^1$, $R^{21}$, and $R^{22}$ has a polymerizable functional group.

9. The optoelectronic device of claim 7, wherein $Ar^1$ is a substituted or unsubstituted C6 to C20 arene group.

10. The optoelectronic device of claim 7, wherein $L^1$ is a C6 to C20 arylene group substituted with a polymerizable functional group.

11. The optoelectronic device of claim 1, wherein the polymer has a weight average molecular weight of about 2000 g/mol to about 7000 g/mol.

12. The optoelectronic device of claim 1, wherein the perovskite compound is a blue perovskite compound or a green perovskite compound.

13. The optoelectronic device of claim 1, which further comprises an electron transport layer between the second electrode and the light emitting layer.

* * * * *